(12) United States Patent
Niendorf et al.

(10) Patent No.: US 6,749,308 B1
(45) Date of Patent: Jun. 15, 2004

(54) MICROMIRROR

(75) Inventors: Andreas Niendorf, Berlin (DE); Karsten Funk, Mountain View, CA (US)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 10/169,247

(22) PCT Filed: Nov. 22, 2000

(86) PCT No.: PCT/DE00/04116

§ 371 (c)(1), (2), (4) Date: Mar. 3, 2003

(87) PCT Pub. No.: WO01/48527

PCT Pub. Date: Jul. 5, 2001

(51) Int. Cl.[7] .............................................. G02B 7/182
(52) U.S. Cl. .................. 359/877; 359/872; 359/871; 359/221
(58) Field of Search ................. 359/877, 872, 359/871, 221, 223, 224, 225, 226, 291, 290, 230, 295, 298, 259, 263, 276, 277; 310/10, 36

(56) References Cited

U.S. PATENT DOCUMENTS

| | | | | |
|---|---|---|---|---|
| 5,508,841 A | * | 4/1996 | Lin et al. ..................... 359/318 |
| 5,665,997 A | * | 9/1997 | Weaver et al. ............... 257/414 |
| 5,670,977 A | * | 9/1997 | Chiu et al. .................... 345/85 |
| 5,748,172 A | | 5/1998 | Song et al. |
| 6,072,617 A | * | 6/2000 | Henck .......................... 359/237 |
| 6,356,378 B1 | * | 3/2002 | Huibers ....................... 359/291 |
| 6,538,799 B2 | * | 3/2003 | McClelland et al. ........ 359/291 |

FOREIGN PATENT DOCUMENTS

| | | |
|---|---|---|
| DE | 197 28 598 | 2/1999 |
| DE | 198 57 946 | 1/2000 |
| EP | 0 754 958 | 1/1997 |
| GB | 2 275 787 | 9/1994 |

* cited by examiner

Primary Examiner—Mohammad Sikder
(74) Attorney, Agent, or Firm—Kenyon & Kenyon

(57) ABSTRACT

A micromirror (5), a micro-oscillating mirror in particular, having an at least largely cantilevered mirror surface (10) which may be displaced from the rest position about at least one torsional axis (17) is described. The mirror surface (10) is linked to at least one support body (11, 12) by at least two torsion beams (13, 13'), which are arranged at least approximately parallel to each other. Also described is the displacement of the micrometer from its rest position by an electrostatic or magnetic interaction.

20 Claims, 1 Drawing Sheet

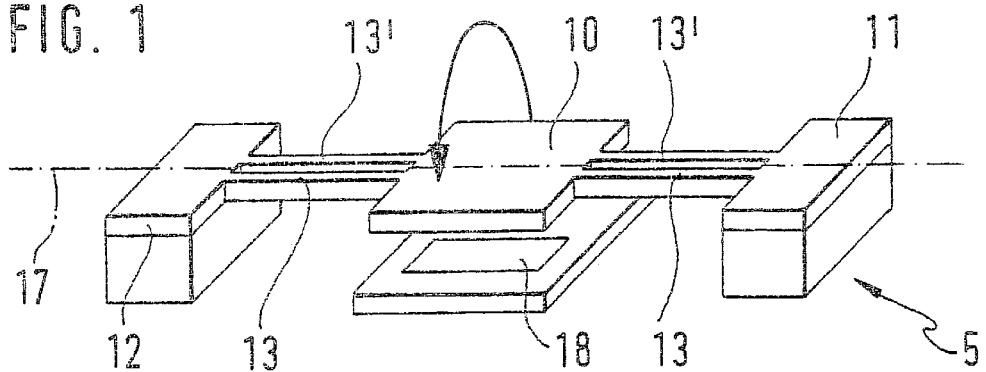
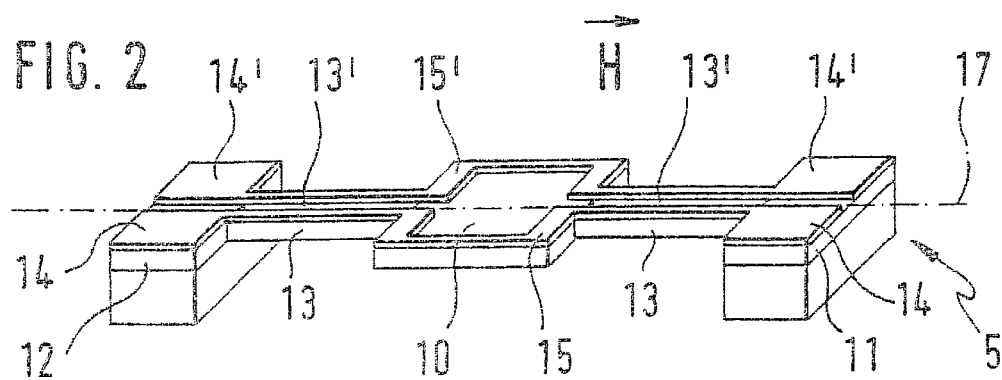
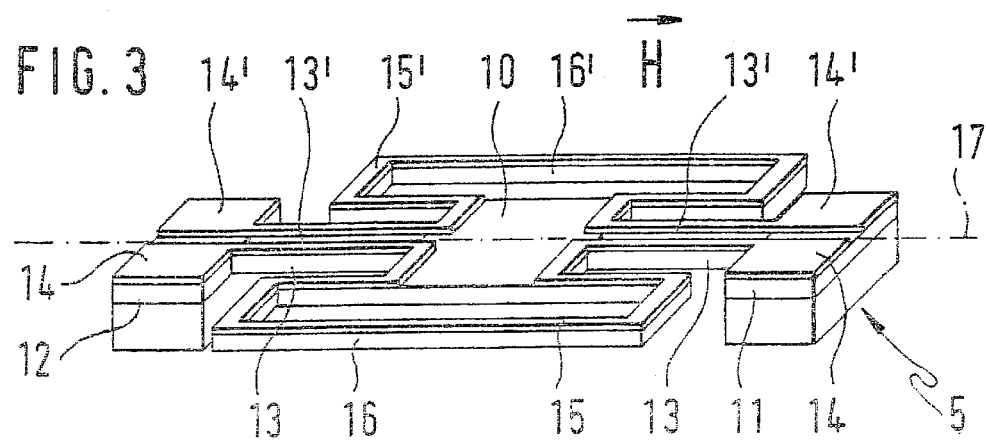

MICROMIRROR

The invention relates to a micromirror, a micro-oscillating mirror in particular, according to the definition of the species of the main claim.

BACKGROUND INFORMATION

A micromirror and, in particular, a micro-oscillating mirror which is equipped with an electrostatic drive, has already been described in German Patent Application 198 57 946.2. A largely cantilevered mirror surface having two or possibly four spring connectors or torsion beams arranged opposite each other in pairs is linked to a surrounding support body.

In addition, a micromirror having a magnetic drive is already known from U.S. Pat. No. 5,748,172. A largely cantilevered membrane is also linked to a surrounding support body by two opposite torsion beams, printed conductors being located on the bottom of the mirror surface in the form of conductor loops or windings, through which an electric current may be routed so that when an external magnetic field is applied, a torque is exerted on the mirror surface.

The object of the present invention was to develop a novel mirror design with an increased mechanical load capacity, which, in particular, is also suitable for a magnetic drive. The increased mechanical load capacity is to be attained by designing the torsion beams or spring connectors linking the mirror surface to the support body to be stronger and more resistant to torsions and shocks.

ADVANTAGES OF THE INVENTION

In contrast to the related art, the micromirror according to the present invention has the advantage of a higher mechanical load capacity and higher fracture stability while at the same time relatively low electrical voltages are required to displace the mirror surface from the rest position or to excite it to torsional oscillation.

In addition, the design of the torsion beams according to the present invention advantageously results in higher motive forces overall being required to displace the mirror surface than in known micromirrors, which results in the cited increased stability.

Finally, the fact that, according to the present invention, the mirror surface is linked to the support body by at least two torsion beams arranged at least approximately parallel to each other with comparable bending strength results in reduced torsional stiffness compared to a single torsion beam which occupies the total width of the parallel torsion beams and the intermediate space between them. Consequently, a larger angle of displacement of the mirror surface is possible with an increased stability of the overall mirror design at the same time.

Advantageous refinements of the invention result from the measures cited in the dependent claims.

It is thus advantageous in particular if each of two opposite sides of the mirror surface is linked to the support body by two torsion beams spaced parallel to each other. In this manner, a printed conductor may be applied to the surface of each torsion beam, which may occupy the entire surface of the torsion beam so that the width of the torsion beam is optimally utilized with simultaneous insulation of the printed conductors from each other. It is, in particular, advantageously possible to route particularly high electric currents of, for example 10, mA to 1 A across the printed conductors located on the surface of the torsion beams.

In addition, the printed conductors routed on the surface of the torsion beams may now be made as wide as possible since the problem of electrically insulating them from each other is eliminated.

Overall, the widened printed conductors and the optimum utilization of the surface of the torsion beams thus result in a higher current carrying capacity, which results in higher magnetic forces or torques in the case of a magnetic drive. Therefore, the design of the micromirror according to the present invention now makes it possible to choose a more robust design of the torsion beams due to the greater forces that may be generated.

The total width of the two torsion beams spaced parallel to each other together with the width of the intermediate space between them is now greater than the width of a corresponding single torsion beam known from the related art.

In addition, the torsion stiffness of the spring design of the present invention is advantageously less than the torsion stiffness of a single torsion beam which occupies the total width of the two parallel torsion beams and the associated intermediate space.

Moreover, the spring design presented may also be advantageously transferred to micromirrors having two torsion axes perpendicular to each other.

It is further advantageous that the printed conductors on the surface of the torsion beams, the contact surfaces located on the support body in some areas and the printed conductors routed on the surface of the mirror surfaces may be produced in a simple manner by surface metallization methods which are known per se.

Moreover, the micromirror according to the present invention may be equipped with either an electrostatic or a magnetic drive.

Finally, providing the actual mirror surface with two loops attached symmetrically in the external area resulting in a distinct increase of the magnetic flux, enclosed by the printed conductors routed on the surface of the mirror surface, in an external magnetic field has the advantage that these loops can be used simultaneously as a stop for the mirror surface and consequently the mirror surface and also the torsion beams, in particular, are protected against shocks and overloads of short duration. For this purpose, in the event of excessively high torsion of the mirror surface, it is advantageously provided that the loops strike the upper or lower side of the housing or the support body and thus prevent the torsion beams from breaking.

These additional loops on the mirror surface are advantageous in particular if the micromirror according to the present invention is to be statically displaced and an air gap is provided to attain as little air cushioning as possible between the mirror surface and the surrounding support body.

In summary, the micromirror of the present invention has the advantage of high motive forces with simultaneous low driving voltages, resulting in an improved stability of the micromirror and an increased yield in manufacturing at the same time since the microstructures produced are more robust as a whole. In addition, the micromirror according to the present invention can be produced using manufacturing methods known per se so that no new procedure steps and manufacturing technologies are required in production.

DRAWINGS

The present invention will be described in greater detail with reference to the drawing and in the following description.

FIG. 1 shows a first exemplary embodiment of a micromirror having an electrostatic drive; FIG. 2 shows a second embodiment having a magnetic drive and FIG. 3 shows a third embodiment of a micromirror with a magnetic drive.

EXEMPLARY EMBODIMENTS

FIG. 1 shows a micromirror 5 which is designed in the form of a micro-oscillating mirror.

In detail, micromirror 5 described has been formed from a support body 11, 12 of, for example, silicon, in a manner known per se, a mirror surface 10 being provided in the form of a rectangle with dimensions of typically 100 $\mu$mm×100 $\mu$m to 400 $\mu$m×400 $\mu$m, two opposite sides of the mirror surface being provided with torsion bars 13, 13' spaced parallel to each other. Torsion bars 13, 13', which act as spring connectors, link mirror surface 10 with support body 11, 12 surrounding the mirror surface, for example, laterally and in the lower area so that mirror surface 10 is largely cantilevered. For this purpose, support body 11, 12 is, for example, a silicon wafer.

Moreover, torsion beams 13, 13' have a length of 10 $\mu$m to 100 $\mu$m, a height of 2 $\mu$m to 10 $\mu$m, and a width of 5 $\mu$m to 15 $\mu$m. In addition, they are arranged parallel to each other at a spacing of 2 $\mu$m to 5 $\mu$m so that there is an intermediate space between torsion beams 13, 13' corresponding to the spacing.

In order to implement an electrostatic drive, an electrode surface is located under mirror surface 10, an electrode 18 being applied to some areas of the electrode surface in a manner known per se. In addition, at least in some areas, the bottom of the mirror surface in particular is provided with a metallization, which is connected to an external voltage supply via printed conductors routed across torsion beams 13, 13'.

In this manner, it is possible to exert an electrostatic force between mirror surface 10 and electrode 18 by applying an electrical voltage to electrode 18 or to mirror surface 10 so that mirror surface 10 is displaced about a torsional axis 17 which lies parallel to the axis defined by torsion beams 13, 13'.

Additional explanations concerning the exemplary embodiment according to FIG. 1, in particular further details concerning the production of micromirror 5, concerning the electrical control and the terminal contacting may be omitted since the person skilled in the art is aware of such details.

FIG. 2 shows an alternative embodiment of the exemplary embodiment according to FIG. 1, a magnetic drive now being used instead of an electrostatic drive. For that purpose, printed conductors 15, 15' are provided on at least one side of mirror surface 10, the printed conductors being expediently routed at the outer edge of the mirror surface so that they enclose as large an area on mirror surface 10 as possible. Printed conductors 15, 15' are, for example, produced in a manner known per se by the application of surface metallizations of gold, for example, in some areas. So that printed conductors 15, 15' in FIG. 2 are able to carry as great an electric current as possible, it is further expedient to design printed conductors 15, 15' to be as thick and broad as possible.

Starting from mirror surface 10, printed conductors 15, 15' are routed across assigned torsion beams 13 and 13', respectively, to electrical contact surfaces 14, 14', which are applied, for example, on support body 11, 12 in a manner known per se. Printed conductors 15, 15' occupy the total surface of respective torsion bar 13, 13' assigned to them.

The electrical separation of the two conductors 15, 15' is ensured by the intermediate space between torsion beams 13, 13'.

The thickness of printed conductors 15, 15' preferably amounts to 100 nm to 2 $\mu$m; however, it may also reach 10 $\mu$m. Their width is expediently between 5 $\mu$m and 50 $\mu$m. Moreover, printed conductors 15, 15' are preferably made of gold.

In addition, the symbol H entered in FIG. 2 indicates that micromirror 5 according to FIG. 2 is located in an external magnetic field.

When micromirror 5 is operated by applying an external electrical voltage of, for example, 10 V to 30 V to two adjacent contact surfaces 14, 14' and by closing the electric circuit with the aid of the two remaining, opposite contact surfaces 14, 14', an electrical current I of, for example, 10 mA to 500 mA flows across printed conductors 15, 15' so that the explained arrangement of printed conductors 15, 15' forms a closed conductor loop, which encloses a surface A defined by the dimension of mirror surface 10.

Accordingly, applied electrical current I and external magnetic field H exert a torque T on mirror surface 10 where:

$$\vec{T} = \vec{I} \cdot \vec{A} \times \vec{B} \text{ and } \vec{B} = \mu_0 \mu_r \vec{H}$$

This torque T, which is in proportion to applied electrical current I, the strength of external magnetic field B or H and surface A enclosed by the conductor loop, thus brings about a twisting, i.e. torsion, of mirror surface 10 about torsional axis 17. A suitable, for example, periodic variation of applied electrical current I and/or of external magnetic field H thus makes it possible also to excite a torsional oscillation of mirror surface 10 in a simple manner.

However, the explained exemplary embodiment is obviously also suitable for a static displacement of mirror surface 10.

On the whole, in order to attain as strong a force as possible or as great a torque as possible on mirror surface 10 in the explained example, it is expedient to route printed conductors 15, 15' on at least one side of the surface of mirror surface 10 in such a way that printed conductors 15, 15' enclose as great a magnetic flux as possible in external magnetic field H.

In continuation of FIG. 2, FIG. 3 illustrates an additional exemplary embodiment of the invention which only differs from FIG. 2 in that mirror surface 10 has lateral loops 16, 16' which are correspondingly suitably formed from support body 11, 12. These loops 16, 16' are preferably arranged symmetrically and are primarily used to ' increase torque T or the enclosed magnetic flux by enlarging the surface enclosed by printed conductors 15, 15'.

Loops 16, 16' according to FIG. 3 have, for example, a total length of 500 $\mu$m to 1 mm and a total width of 100 $\mu$m to 500 $\mu$m. Their thickness corresponds to the thickness of mirror surface 10. In addition, loops 16, 16' are formed similar to torsion beams 13, 13', i.e., they have the shape of narrow connectors which enclose a space, the assigned printed conductor 15 or 15' respectively being routed on the surface of the connectors and this surface preferably being completely covered.

Because mirror surface 10 in FIG. 3 is provided with loops 16, 16', the conductor loop, which is produced when the electric circuit is closed, encloses a larger surface as a whole so that a significantly increased torque T can be produced with the same current I and the same magnetic field H.

Moreover, the externally applied magnetic field has a strength of preferably 1 mTelsa to 1000 mTesla and is generated, for example, by a permanent magnet or an electromagnet situated in the vicinity of mirror surface 10.

What is claimed is:

1. A micromirror, comprising:
   at least one support body;
   at least two torsion beams arranged at least approximately in parallel to each other; and
   an at least largely cantilevered mirror surface displaceable from a rest position about at least one torsional axis, the mirror surface connected to the support body by the torsion beams;
   wherein the two torsion beams extend parallel to the torsional axis from one lateral edge of the mirror to the support body.

2. The micromirror according to claim 1, wherein the micromirror includes a micro-oscillating mirror.

3. The micromirror according to claim 1, wherein the torsion beams are spaced in parallel to each other.

4. The micromirror according to claim 1, wherein the at least two torsion beams include four torsion beams arranged in two pairs, each pair including two torsion beams arranged adjacent to each other with spacing, the four torsion beams defining a common torsional axis.

5. The micromirror according to claim 1, wherein the mirror surface one of includes printed conductors and is at least superficially metallized is some areas.

6. The micromirror according to claim 1, further comprising at least one contact surface and the mirror surface includes at least one printed conductor, the mirror surface electrically linked to the support body by the printed conductor.

7. The micromirror according to claim 6, wherein the support body includes at least one contact surface.

8. The micromirror according to claim 1, further comprising an arrangement configured to cause a displacement of the mirror surface about the torsional axis.

9. The micromirror according to claim 8, wherein the displacement includes one of a static torsion and a torsion oscillation.

10. The micromirror according to claim 7, wherein the arrangement includes at least one electrode arranged in a vicinity of the mirror surface configured to one of displace the mirror surface from a rest position and to excite the mirror surface into a torsion oscillation by electrostatic interaction.

11. The micromirror according to claim 1, wherein the mirror surface includes a surface having areas with printed conductors linked electroconductively to the support body via the torsion beams.

12. The micromirror according to claim 11, wherein the support body includes contact surfaces to electroconductively link to the areas with printed conductors.

13. The micromirror according to claim 11, wherein each printed conductor extends in a planar manner on at least one side of a surface of an assigned torsion beam.

14. The micromirror according to claim 13, wherein the printed circuit at least largely covers the surface of the assigned torsion beam.

15. The micromirror according to claim 11, wherein the printed conductors extend on at least one side of the surface of the mirror surface so that as great a magnetic flux as possible is enclosed by the printed conductors in an external magnetic field.

16. The micromirror according to claim 11, wherein the printed conductors extend on at least one side of the surface of the mirror surface so that as great a torque as possible is exerted on the mirror surface in an external magnetic field with an electric current routed through the printed conductors.

17. The micromirror according to claim 11, wherein the printed conductors are arranged on the surface of the mirror surface in the form of a conductor loop.

18. The micromirror according to claim 1, wherein the mirror surface includes at least one loop having a printed conductor arranged on its surface to increase one of a torque and a magnetic flux.

19. The micromirror according to claim 18, wherein the at least one loop includes two symmetrically configured loops.

20. The micromirror according to claim 18, wherein the loops have as low a weight as possible and one of enclose as great a magnetic flux as possible in an external magnetic field and exert as great a torque as possible on the mirror surface when an electric current is routed through the printed conductors.

\* \* \* \* \*

UNITED STATES PATENT AND TRADEMARK OFFICE
CERTIFICATE OF CORRECTION

PATENT NO. : 6,749,308 B1
DATED : June 15, 2004
INVENTOR(S) : Niendorf et al.

It is certified that error appears in the above-identified patent and that said Letters Patent is hereby corrected as shown below:

Title page,
Item [75], ABSTRACT, delete "(5) (10) (17) (10) (11, 12) (13, 13')"

Column 1,
Line 1, insert -- Field of the Invention --
Line 3, change "The invention" to -- The present invention --
Line 4, change "oscillating mirror in particular…..the main claim." to -- oscillating mirror, for example --
Line 11, change "German Patent Application 198 57 946.2." to -- German Published Patent Application No. 198 57 946.2. --
Line 16, change "already known from" to -- already described in --
Line 24, insert -- Summary of the Invention --
Line 24, change "The object of the present invention was to develop" to -- An object of the present invention may be to develop --
Line 26, change "is also suitable" to -- may also be suitable --
Line 27, change "is to be obtained" to -- may be obtained --
Line 28, change "designing the tension beams" to -- configuring the tension beams --
Line 32, delete "Advantages of the Invention"
Line 34, change "invention has the advantage of" to -- invention may provide --
Line 36, change "voltages are required" to -- voltages may be required --
Line 39, change "In addition, the design" to -- In addition, a configuration --
Line 40, change "advantageously results in" to -- may results in --
Line 43, change "in known micromirrors, which results in" to -- in conventional micromirrors, which may result in --
Line 45, change "Finally, the fact that," to -- Furthermore, the feature that, --
Line 46 and 58, change "surface is linked" to -- surface may be linked --
Line 48, change "strength results in "to -- strength may result in --
Line 53, change "surface is possible"to -- surface may be possible --
Line 54, change "mirror design" to -- mirror configuration --
Lines 55-57, change "Advantageous refinements…if each of two" to -- Each of two --
Line 63, change "beam is optimally utilized" to -- beam may be optimally utilized --
Lines 64-65, change "It is, in particular,…particularly high electric" to -- Particularly high electric --
Line 66, change "10, mA to 1 A across the printed" to -- 10 mA to 1 A may be routed across the printed --

UNITED STATES PATENT AND TRADEMARK OFFICE
CERTIFICATE OF CORRECTION

PATENT NO. : 6,749,308 B1
DATED : June 15, 2004
INVENTOR(S) : Niendorf et al.

It is certified that error appears in the above-identified patent and that said Letters Patent is hereby corrected as shown below:

Column 2,
Line 4, change "other is eliminated" to -- other may be eliminated --
Line 6, change "thus results in" to -- thus may result in --
Line 7, change "which results in" to -- which may results in --
Line 9, change "Therefore, the design"to -- Therefore, the configuration --
Line 10, change "now makes it possible" to -- may now make it possible
Line 15, change "is now greater" to -- now may be greater --
Lines 16-17, change "corresponding single torsion beam known from the related art." to -- corresponding conventional single torsion beam. --
Lines 18 and 23, change "the spring design" to -- the spring configuration --
Line 19, change "is advantageously less" to -- may be less --
Line 23, change "the spring design" to -- the spring configuration --
Line 26, change "It is further advantageous that the printed conductors" to -- The printed conductors --
Lines 30-31, change "by surface metallization methods which are known per se." to -- by conventional surface metallization methods. --
Line 35, change "Finally, providing" to -- Furthermore, providing --
Line 39, change "field has the advantage that" to -- field may provide the feature that --
Line 40, change "loops can be used" to -- loops may be used --
Line 42, change "are protected against" to -- may be protected against --
Lines 44-45, change "it is advantageously provided" to -- it may be provided --
Lines 46-47, change "and thus prevent" to -- and thus may prevent --
Lines 48-49, change "mirror surface are advantageous" to -- mirror sruface may be desirable --
Lines 54-55, change "invention has the advantage of" to -- invention may provide --
Lines 58-59, change "are more robust" to -- may be more robust --
Lines 60-61, change "can be protected using manufacturing methods known per se" to -- using conventional manufacturing methods --
Line 62, change "are required in production." to -- may be required in production. --
Lines 64-67, delete "DRAWINGS The present invention...the following description."

Column 3,
Line 1, insert heading -- Brief Description of the Drawings --
Line 2, change "electrostatic drive;" to -- electrostatic drive. --
Line 3, change "magnetic drive and" to -- magnetic drive --
Line 4, change "third embodiment" to -- third exemplary embodiment --
Line 5, change "Exemplary Embodiments" to -- Detailed Description --
Line 6, change "which is designed in" to -- which is configured in --
Line 10, change "in a manner" to -- in a conventional manner, --
Line 11, delete "known per se,"

UNITED STATES PATENT AND TRADEMARK OFFICE
CERTIFICATE OF CORRECTION

| | | |
|---|---|---|
| PATENT NO. | : 6,749,308 B1 | |
| DATED | : June 15, 2004 | |
| INVENTOR(S) | : Niendorf et al. | |

It is certified that error appears in the above-identified patent and that said Letters Patent is hereby corrected as shown below:

Col. 3 (cont'd),
Line 12, change "of typically 100 $\mu$mm x 100" to -- of, for example, 100$\mu$m x 100 --
Line 20, change "beams 13, 13' have a length" to -- beams 13, 13' may have a length --
Line 22, change "they are arranged" to -- they may be arranged --
Line 29, change "manner known per se." to -- conventional manner --
Line 30, change "is provided with" to -- may be provided with --
Line 31, change "which is connected to" to -- which may be connected to --
Line 34, change "it is possible" to -- it may be possible --
Line 44, change "is aware of" to -- may be aware of --
Line 51, change "they enclose" to -- they may enclose --
Line 52, change "conductors 15, 15' are," to -- conductors 15, 15' may be, --
Line 53, change "in a manner known per se" to -- in a conventional manner --
Line 55, change "in FIG. 2 are able" to -- in FIG. 2 may be able --
Line 56, change "it is further expedient" to -- it may be further expedient --
Line 57, change "to design printed conductor" to -- to configure printed conductors --
Lines 62-63, change "in a manner known per se" to -- in a conventional manner. --
Lines 65-66, change "conductors 15, 15' is ensured" to -- conductors 15, 15' may be ensured --

Column 4,
Lines 1-2, change "conductors, 15, 15' is ensured" to -- conductors 15, 15' may amount to --
Line 3, change "width its expediently" to -- width may be expediently --
Line 4, change "are preferably made of" to -- may be made of --
Line 26, change "thus brings about" to -- thus may bring about --
Line 30, change "thus makes it possible" to -- thus may make it possible --
Line 38, change "it is expedient" to -- it may be expedient --
Line 40, change "such a way that" to -- such a manner that --
Line 47, change "loops 16, 16' are" to -- loops 16, 16' may be --
Line 48, change "and are primarily used" to -- and may be primarily used --
Line 58, change "this surface preferably being" to -- this surface may be --

UNITED STATES PATENT AND TRADEMARK OFFICE
CERTIFICATE OF CORRECTION

PATENT NO. : 6,749,308 B1
DATED : June 15, 2004
INVENTOR(S) : Niendorf et al.

It is certified that error appears in the above-identified patent and that said Letters Patent is hereby corrected as shown below:

Col. 4, (cont'd),
Line 63, "torque T can be" to -- torque T may be --
Line 67, change "strength of preferably" to -- strength of, for example --
Line 67, change "and is" to -- and may be --

Signed and Sealed this

Twenty-fourth Day of May, 2005

JON W. DUDAS
*Director of the United States Patent and Trademark Office*